(12) United States Patent
Terrien

(10) Patent No.: US 12,341,413 B2
(45) Date of Patent: Jun. 24, 2025

(54) MONITORING DEVICE FOR A POWER CONVERTER, ASSOCIATED MONITORING SYSTEM, POWER SUPPLY SYSTEM AND METHOD

(71) Applicant: GE ENERGY POWER CONVERSION TECHNOLOGY LIMITED, Warwicksire (GB)

(72) Inventor: Franck Terrien, Belfort (FR)

(73) Assignee: GE ENERGY POWER CONVERSION TECHNOLOGY LIMITED, Warwicksire (GB)

( * ) Notice: Subject to any disclaimer, the term of this patent is extended or adjusted under 35 U.S.C. 154(b) by 0 days.

(21) Appl. No.: 18/356,869

(22) Filed: Jul. 21, 2023

(65) Prior Publication Data

US 2024/0039386 A1 Feb. 1, 2024

(30) Foreign Application Priority Data

Jul. 27, 2022 (EP) .................................. 22187270

(51) Int. Cl.
| | |
|---|---|
| H02M 1/00 | (2007.01) |
| H02M 1/36 | (2007.01) |
| H03K 17/0812 | (2006.01) |
| H03K 19/21 | (2006.01) |

(52) U.S. Cl.
CPC ........... *H02M 1/0041* (2021.05); *H02M 1/36* (2013.01); *H03K 17/0812* (2013.01); *H03K 19/21* (2013.01)

(58) Field of Classification Search
CPC .................................................. H02M 1/0041
USPC ........................................................ 307/140
See application file for complete search history.

(56) References Cited

U.S. PATENT DOCUMENTS

| | | | |
|---|---|---|---|
| 10,671,111 B1* | 6/2020 | Spaggiari | G06F 1/04 |
| 2015/0061628 A1* | 3/2015 | Nguyen | H03K 5/135 |
| | | | 323/282 |
| 2016/0197560 A1 | 7/2016 | Leedham et al. | |
| 2020/0195155 A1* | 6/2020 | Colbeck | H02M 3/33571 |

FOREIGN PATENT DOCUMENTS

JP 2013138389 A 7/2013

OTHER PUBLICATIONS

European Extended Search Report for EP Application No. 22187270.8 dated Jan. 17, 2023, 9 pages.

* cited by examiner

*Primary Examiner* — Joseph Chang

(57) ABSTRACT

Provided is a monitoring device for monitoring a control signal received by a power converter, the control signal controlling switches to supply an electrical load. The monitoring device includes a receiving circuit that receives the control signal comprising a merging of a first variable signal and a clock signal having a predetermined frequency greater than the first variable signal, a determining circuit that determines if a change of state of the control signal occurs during each period associated to the predetermined frequency, and a monitoring circuit that stops the transmission of the control signal to the power converter so that the power converter stops to supply the electrical load according to the instructions of the first variable signal if a change of state of the control signal does not occur during one period.

12 Claims, 7 Drawing Sheets

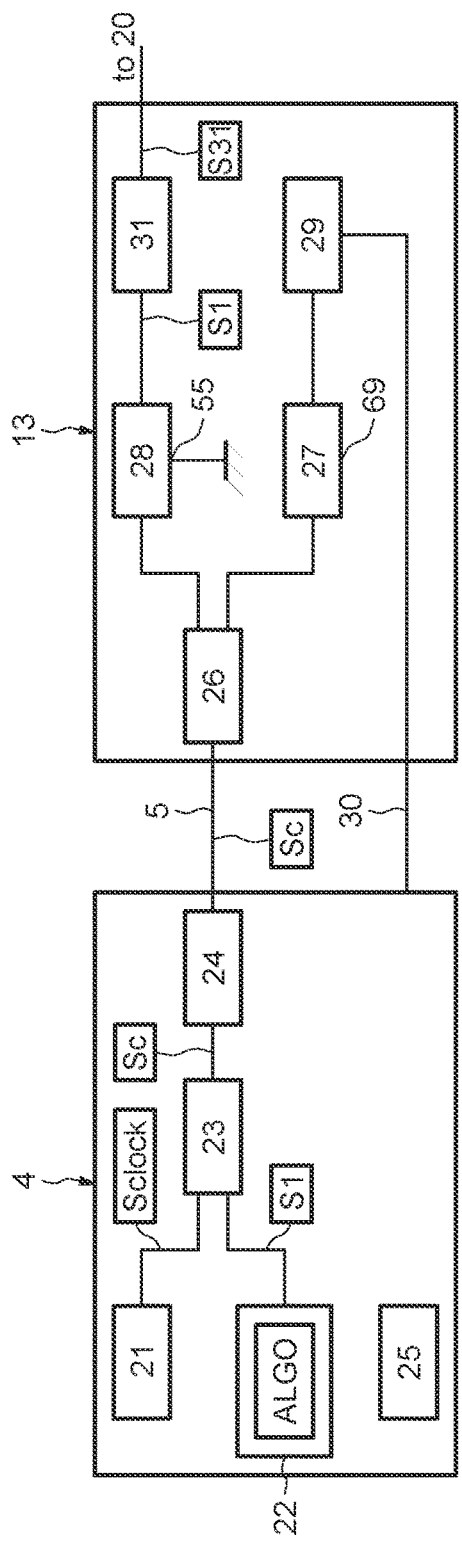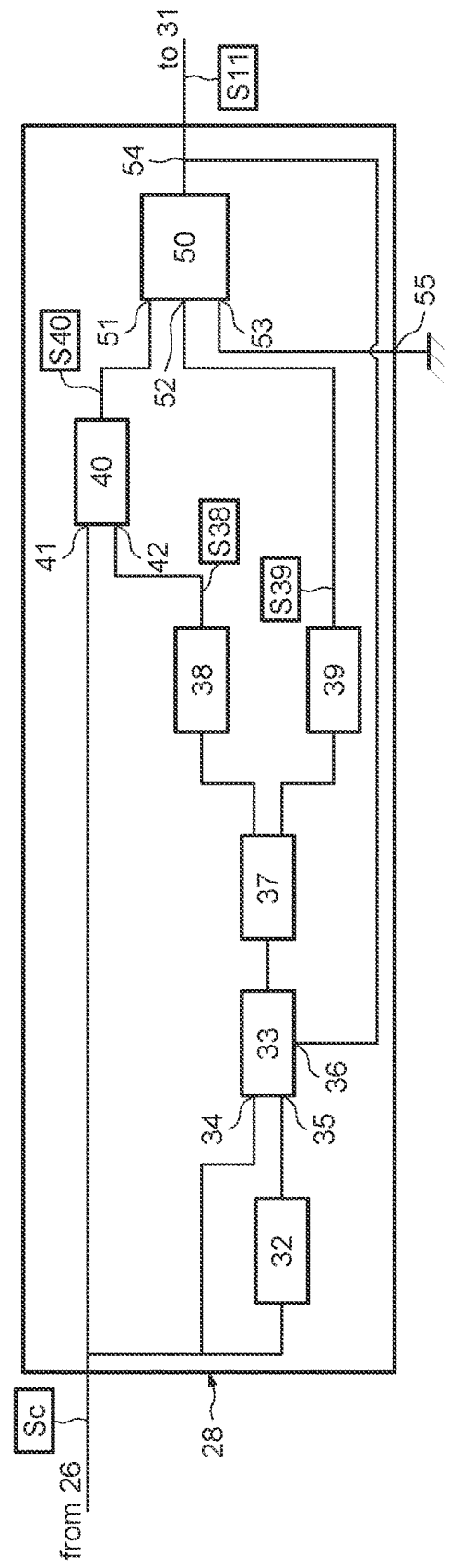

MONITORING DEVICE FOR A POWER CONVERTER, ASSOCIATED MONITORING SYSTEM, POWER SUPPLY SYSTEM AND METHOD

CROSS-REFERENCE TO RELATED APPLICATIONS

This application claims priority to European Patent Application Serial Number 22187270.8, filed Jul. 27, 2022, which is herein incorporated by reference.

TECHNICAL FIELD

The present invention concerns power converts and relates more particularly to the monitoring of signals received by power converters to control the switches of the power converters.

The present invention also relates to a method and a system for monitoring a control signal received by a power converter.

BACKGROUND OF THE INVENTION

A power converter is generally controlled by a controlling unit comprising an interface board connected by a wired connection to an interface board of the power converter.

The wired connection may comprise fibres, the wired connection being an optical connection.

The controlling unit generates control signals to control switches of the power controller so that the controller delivers, for example a sinusoidal power signal from a continuous power source to supply an electrical load.

The switches may comprise power transistors.

The interface board of the power converter is connected to gate drivers of the power converter controlling the power transistors.

The control signals may be PWM control signals "Pulse Width Modulation" varying between a high logical state and a low logical state.

The low logical state may be a null voltage and is generally indicative of an off state of the power transistors.

When the interface board of the power converter receives a low logical state, the power converter is not able to determine if the null logical state is generated by the controlling unit or is the result of for example a breakdown of the wired connection, a failure of an interface board or a bad connection of the wired connection and an interface board.

A misinterpretation of the low logical state by the gate drives may generate an overcurrent in the power controller causing a failure of the power converter.

It is therefore proposed to remedy the disadvantage related to the transmission of control signals, and more particularly to determine if the low logical state is generated to control the power controller or results from a failure.

SUMMARY OF THE INVENTION

In view of the foregoing the invention proposes a method for monitoring a control signal received by a power converter, the control signal controlling switches of the power converter to supply an electrical load.

The method comprising:
receiving by the power converter a control signal comprising a merging of a first variable signal and a clock signal having a predetermined frequency greater than the first variable signal, the first variable signal comprising instructions to control the switches,
determining if a change of state of the control signal occurs during each period associated to the predetermined frequency, and
if a change of state of the control signal does not occur during one period, stopping the transmission of the control signal to the power converter so that the power converter stops to supply the electrical load according to the instructions of the first variable signal.

Preferably, merging the first variable signal and the clock signal comprises combining the first variable signal and the clock signal by XOR logical operator to obtain the control signal.

Advantageously, when a change of state of the control signal occurs during each period, the method further comprises:
decoding the control signal by a decoding circuit of the power control to extract the first variable signal,
controlling the power converter according to the decoded first variable signal.

Preferably, decoding the control signal comprises:
determining the frequency and the phase of the clock signal from the control signal,
providing two intermediate signals from the determined frequency and phase,
the frequency of a first intermediate signal being equal to the determined frequency and the phase of the first intermediate signal being equal to the determined phase so that the first intermediate signal is an estimation of the clock signal, and the frequency of second intermediate signal being equal to twice the determined frequency and the phase of the second intermediate signal being shifted so that the raising edge of the second intermediate signal is centred on the middle of the high state of the first intermediate signal,
combining the control signal and first intermediate signal by XOR logical operator to obtain an intermediate control signal, and
sampling the intermediate control signal with the raising edge of the second intermediate signal to generate a first variable control signal within a predetermine value, the first variable control signal being configured to control the switches.

Advantageously, the method further comprises:
determining if a change of state of a second control signal occurs during each period associated to the predetermined frequency, the second control signal comprising the variable signal comprising instructions to control the switches merged with a second clock signal having the predetermined frequency,
if a change of state of a second control signal occurs during each period associated to the predetermined frequency, decoding the second control signal to extract a second variable control signal, and
if the transmission of the control signal to the power converter is stopped, controlling the power converter according to the second variable signal.

Preferably, if the transmission of the control signal to the power converter is transmitted again, the power converter is still controlled by the second variable control signal as long as the second control signal is transmitted to the power controller.

Another object of the invention relates to a monitoring device for monitoring a control signal received by a power converter, the control signal controlling switches of the power converter to supply an electrical load.

The monitoring device comprises:
- a receiving circuit for receiving the control signal comprising a merging of a first variable signal and a clock signal having a predetermined frequency greater than the first variable signal, the first variable signal comprising instructions to control the switches,
- a determining circuit for determining if a change of state of the control signal occurs during each period associated to the predetermined frequency, and
- a monitoring circuit for stopping the transmission of the control signal to the power converter so that the power converter stops to supply the electrical load according to the instructions of the first variable signal if a change of state of the control signal does not occur during one period.

Advantageously, the monitoring device further comprises:
- a decoding circuit for decoding the control signal to extract a first variable control signal, and
- a control circuit for controlling the power converter according to the first variable control signal,
- the decoding circuit being configured to:
- determine the frequency and the phase of the clock signal from the control signal,
- provide two intermediate signals from the determined frequency and phase,
- the frequency of a first intermediate signal being equal to the determined frequency and the phase of the first intermediate signal being equal to the determined phase so that the first intermediate signal is an estimation of the clock signal, and the frequency of second intermediate signal being equal to twice the determined frequency and the phase of the second intermediate signal being shifted so that the raising edge of the second intermediate signal is centred on the middle of the high state of the first intermediate signal,
- combine the control signal and first intermediate signal by XOR logical operator to obtain an intermediate control signal, and
- sample the intermediate control signal with the raising edge of the second intermediate signal to generate the first variable control signal within a predetermined value when a change of state of the control signal occurs at each period.

Another object of the invention relates to a monitoring system for monitoring a control signal received by a power converter comprising:
- at least one monitoring device as defined above, and
- a control unit connected to the receiving circuit of the monitoring device with a first wired connection,
- the control unit comprising a merging circuit to merge the first variable signal and the clock signal by a XOR logical operator to obtain the control signal and a transmitter to transmit the control signal to the monitoring device through the first wired connection.

Advantageously, the monitoring system further comprises a second monitoring device as defined above, a second wired connection connecting the receiving circuit of the second monitoring device to the control unit, and a selection circuit, the control unit further comprising:
- a second merging circuit to merge the first variable signal with a second clock signal having the predetermined frequency to obtain a second control variable signal,
- a second transmitter transmitting the second control signal to the second monitoring device through the second wired connection,
- the selection circuit being configured to transmit the extracted second variable control signal to control the switches of the power converter to supply the electrical load according to the instructions of the extracted second variable signal if a change of state of the second control signal occurs during each period associated to the predetermined frequency and if the transmission of the control signal to the power converter is stopped.

Preferably, the selection circuit is further configured to still transmit the second variable control signal if the transmission of the control signal to the power converter is transmitted again as long as the second control signal is transmitted to the power controller.

Another object of the invention relates to a power supply system comprising a converter including gate drivers driving the switches of the power converter, and a monitoring system as defined above, each monitoring device being coupled to the gate drivers.

BRIEF DESCRIPTION OF THE DRAWINGS

Other characteristics and advantages of the invention will emerge on reading the following description of embodiments of the invention, provided solely by way of non-limiting examples and with reference to the drawings in which:

FIG. 2 illustrates an example of the monitoring system according to the invention, FIG. 3 illustrates an example of the decoding circuit according to the invention.

DETAILED DESCRIPTION OF THE INVENTION

Figure 1:
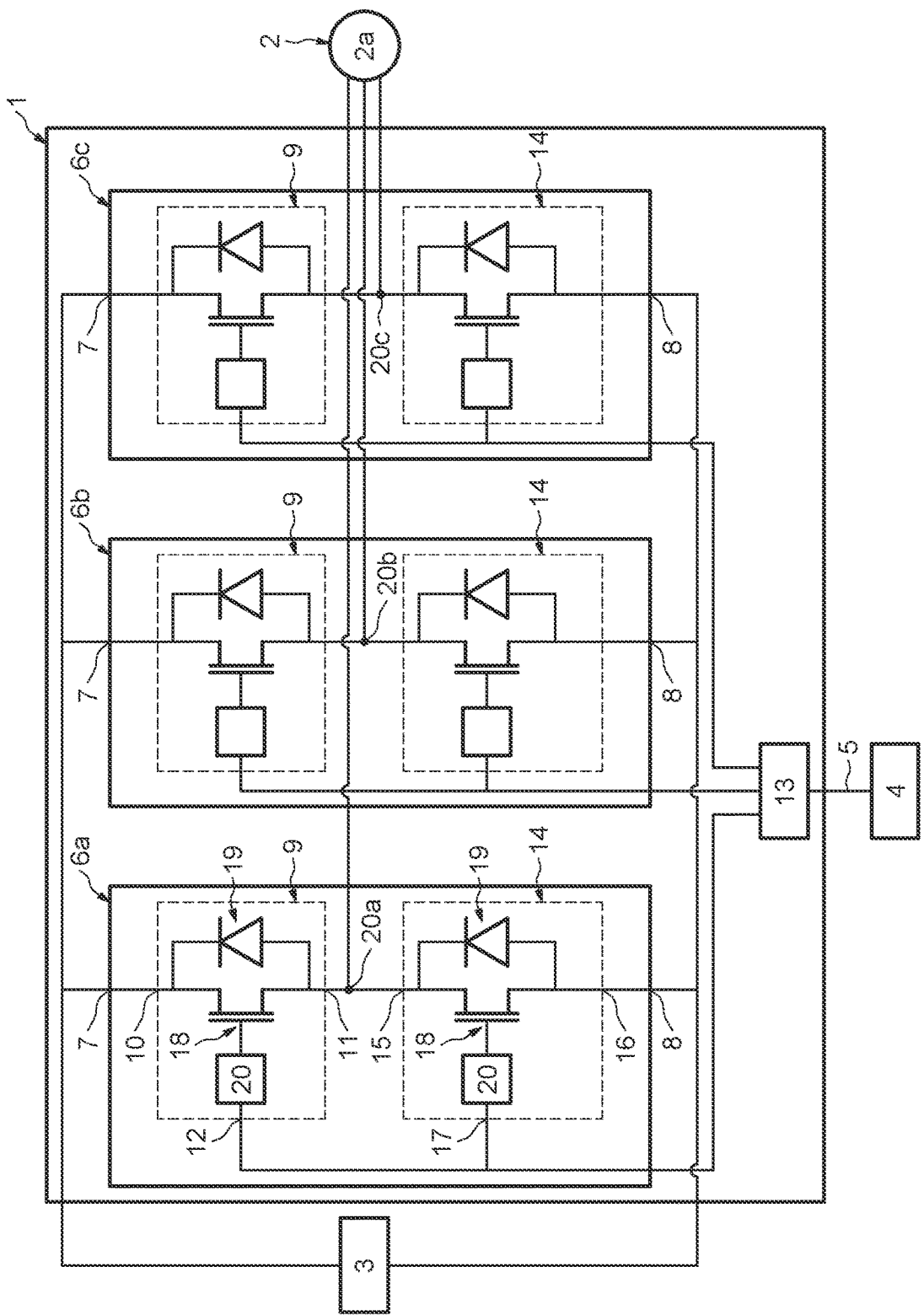
FIG. 1 illustrates an example of a power supply system according to the invention.

FIG. 1 illustrates schematically an example of a power supply system comprising a power converter 1, an electrical load 2 supplied by the power converter 1, an electrical supply network 3 connected to the power converter 2, and a control unit 4 connected to the power converter 2 with a wired connection 5.

The electrical load 2 may be a three-phase motor 2a.

The wired connection 5 may be an optical fibre.

The power converter 1 comprises three identical switching arms 6a, 6b, 6c comprising each a first end 7 and a second end 8 connected to the electrical supply network 3 supplying the switching arms 6 and delivering for example a continuous voltage.

Each switching arm 6a, 6b, 6c comprises a first switch 9 comprising a first end 10 connected to first end 7 of the switching arm 6a, 6b, 6c, a second end 11, and a control input 12 connected to a monitoring device 13 of the power converter.

The monitoring device 13 may be disposed in the power converter 1.

Each switching arms 6a, 6b, 6c further comprises a second switch 14 comprising a first end 15 connected to the second end 11 of the first switch 9, a second end 16 connected to the second end 8 of the switching arm 6a, 6b, 6c, and a control input 17 connected to the monitoring device 13.

Each first and second switches 9, 14 comprise a transistor 18, a diode 19 and a gate driver 20.

The diode 19 may be the internal diode of the transistor 19.

The transistor 18 may be a MOSEFET "metal-oxide semiconductor field-effect transistor" transistor or an IGBT transistor "Insulated Gate Bipolar Transistor".

The drain of the transistor 18 is connected to the first end 10, 15 and to the cathode of the diode 19 of the said switch 9, 14.

The source of the transistor 18 is connected to the second end 11, 16 and to the anode of the diode 19 of the said switch 9, 14.

The gate of the transistor 18 is connected to the gate driver 20.

Each switching arm 6a, 6b, 6c comprises a power connection 20a, 20b, 20c between the first and second ends 15, 11 of the second and first switches 14, 9.

Each power connection 20a, 20b, 20c is connected to a different phase of the load 2.

The control unit 4 controls the gate drivers 20 so that the arms 6a, 6b, 6c supply the motor 2a with a balanced three-phase supply system generated from the network 3, the motor 2a generating a torque.

In another embodiment, the control unit 4 controls the gate drivers 20 so that the motor 2a generates electric power from a torque applied on a rotor shaft of the motor 2a, the electric power being injected in the network 3 by the power converter 1.

The power supply system further comprises a monitoring system for monitoring a control signal generated by the control unit 4 and received by the monitoring device 13 through the wired connection 5, the control signal controlling the switches 9, 14.

The monitoring system comprises the control unit 4 and the monitoring device 13 connected with the control unit 4 through the wired connection 5.

FIG. 2 illustrates an example of the monitoring system.

The control unit 4 comprises a clock 21 generating a clock signal Sclock at a predetermined frequency Fc, a control module 22, a merging circuit 23, a transmitter, and a processing unit 25.

The control module 22 comprises an algorithm ALGO and generates a first variable signal S1 comprising instructions to control the switches 9, 14 of the power converter 1.

The algorithm ALGO comprises for example a PWM control algorithm "Pulse Width Modulation".

The merging circuit 23 comprises a XOR logical operator to merge the clock signal Sclock and the first variable signal S1, and delivers a first control signal Sc to the transmitter 24.

The transmitter 24 delivers the first control signal Sc on the wired connection 5.

The processing unit 25 implements the clock 21, the control module 22, the merging circuit 23 and the transmitter 24.

The monitoring device 13 comprises a receiving circuit 26 for receiving the first control signal Sc from the wired connection 5 connected to a determining circuit 27 and a decoding circuit 28, a monitoring circuit 29 connected to the determining circuit 27 and the control unit 4 through a feed-back wired connection 30, and a control circuit 31 connected to the decoding circuit 28 and the gate drives of the first and second switches 9, 14.

The determining circuit 27 determines if a change of state of the control signal Sc occurs during each period Tclock associated to the predetermined frequency Fclock. The period Tclock is equal to:

$$Tclock = \frac{1}{Fclock} \quad (1)$$

If during a period Tclock the determining circuit 27 determines that no change of state of the control signal Sc occurs during at least one period Tclock, the monitoring circuit 29 sends a message to the control unit 4 through the feed-back wired connection 30 so that the processing unit 25 stops the transmission of the control signal Sc to the power converter 1.

The power converter 1 stops to supply the electrical load according to the instructions of the control signal Sc.

As the control signal Sc comprises the clock signal Sclock, the state of the control signal Sc changes at least one time every period Tclock.

As long as the monitoring device 13 receives the control signal Sc, the determining circuit 27 detects the change of the state of the control signal Sc.

When the determining circuit 27 does not detect the change of the state of the control signal Sc, the monitoring circuit 29 concludes that the transmission of the control signal Sc from the control unit 4 to the monitoring device 13 is interrupted and warns the control unit 4.

As long as the determining circuit 27 detects a change of the state of the control signal Sc during the period Tclock, the decoding circuit 28 decodes the control signal Sc to extract the first variable signal S1 and sends the extracted first variable signal S1 to the control circuit 31 for controlling the gate drivers 20.

The control circuit 31 conditions the signal S1 to control the gate drivers 20 and delivers a variable control signal S31 driving the gate drivers 20.

FIG. 3 illustrates schematically an example of the decoding circuit 28.

The decoding circuit 28 comprises a NOT logical operator 32 receiving the control signal Sc.

The decoding circuit 28 comprises a switch 33 comprising a first input 34 receiving the control signal Sc, a second input 35 connected to an output of the NOT logical operator 32, and a control input 36.

The decoding circuit 28 further comprises a phase-locked loop 37 connected to an output of the switch 33.

The decoding circuit 28 further comprises a first clock signal generator 38 and a second clock signal generator 39, both connected to an output of the phase-locked loop 37.

The decoding circuit 28 further comprises a XOR logical operator 40 comprising a first input 41 receiving the control signal Sc and a second input 42 connected to an output of the first clock signal generator 38, and a gated D latch 50 comprising a data input 51 connected to an output of the XOR logical operator 40, a clock input 52 connected to an output of the second clock signal generator 39, and a reset input 53 connected to a second input 55 of the decoding circuit 28.

The second input 55 is connected to a mass of the monitoring device 13.

The gated D latch 50 comprises an output 54 connected to the control input 36 and to the control circuit 31.

The phase-locked loop 37 tracks the frequency and the phase of a signal outputted by the switch 33.

The switch 33 is controlled so that the phase of the signal at the input of the phase-locked loop 37 is not inverted to avoid that the phase-locked loop 37 is defaulting during an inversion of the phase of the inputted signal.

When the output 54 of the gated D latch 50 delivers a low state, for example a "0" in Boolean algebra, the first input 34 is connected to the output of the switch 33, and when the output 54 of the gated D latch 50 delivers a high state, for example a "1" in Boolean algebra, the second input 35 is connected to the output of the switch 33.

The first clock generator 38 delivers a first intermediate signal S38 of the clock signal Sclock, the frequency of the first intermediate signal S38 being equal to determined frequency by the phase-locked loop 37, and the phase of the first intermediate signal S38 being equal to the determined phase so that the first intermediate signal S38 is an estimation of the clock signal Sclock.

The second clock generator 39 delivers a second intermediate signal S39, the frequency of second intermediate signal being equal to twice the determined frequency and the phase of the second intermediate S39 signal being shifted so that the raising edge of the second intermediate signal S39 is centred on the middle of the high state of the first intermediate signal S38.

The XOR logical operator 40 delivers an intermediate control signal S40 indicative of the first variable signal S1.

The accuracy of the signal S40 depends on the accuracy of the clock estimation signal S38 delivers by the first clock generator 38.

The clock estimation signal S38 presents small shift phase compared to the clock signal Sclock generated by the clock 21 involving unexpected behaviour on the intermediate control signal S40 resulting from the XOR logical operator 40.

To enhance the accuracy of the estimated first variable signal S1 by the monitoring device 13, the intermediate control signal S40 is sampled by the gated D latch 50 using the second intermediate signal S39.

The output 54 of the gated D latch 50 delivers a signal S11 equal to the first variable signal S1 within a predetermined value chosen so that the converter 1 supplies the load 3 as expected.

Figure 4:
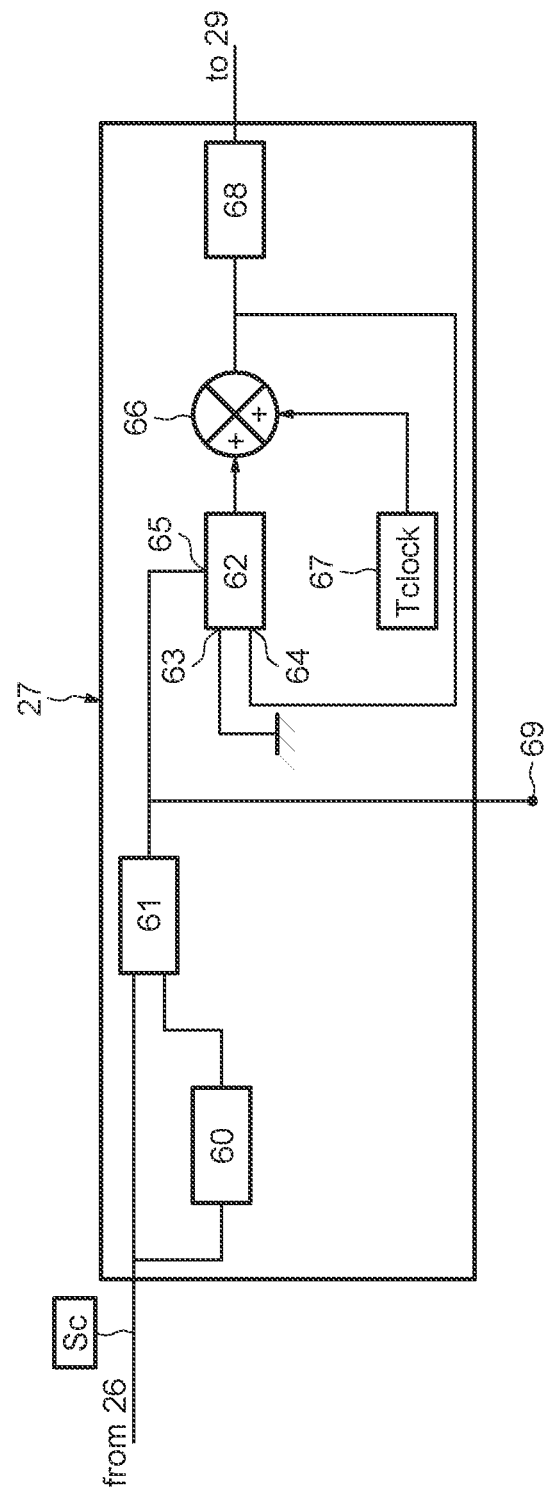
FIG. 4 illustrates an example of the determining circuit according to the invention.

FIG. 4 illustrates schematically an example of the determining circuit 27.

The determining circuit 27 comprises a self-timer 60 receiving the first control signal Sc and outputting the first control signal Sc delayed from one period Tclock, an AND logical operator 61 comprising a first input receiving the first control signal Sc and a second input connected to the output of the self-timer 60.

The determining circuit 27 further comprises a switch 62 comprising a first input 63 connected to a mass delivering a "0" in Boolean algebra, a second input 64 and a control input 65 connected to an output of the AND logical operator 61.

An output of the switch 62 is connected to a first input of an adder 66.

A memory 67 delivers the value of the period Tclock on a second input of the adder 66.

An output of the adder 66 delivers the sum of the signals received on his first and second inputs to the second input 64 of the switch 62 and to an input of a comparator 68.

The comparator 68 compares the received value to the value of the period Tclock.

The output of the comparator 68 is connected to the feed-back wired connection 30.

The determining circuit 27 further comprises a second output 69 connected to the output of the AND logical operator 61.

The second output 69 is used when the monitoring system comprises two monitoring devices as described in the following.

It is assumed that at a period Tn−1, n being an integer greater than one, a change of state of the control signal Sc is detected, Tn being the current period so that the output of the adder 66 is greater than or equal to the period Tclock.

As long as the state of the control signal Sc changes during each period Tclock, the AND logical operator 61 delivers a logical "1" so that the switch 62 connects the second input 64 with the output of the switch 62.

The output of the adder 66 delivers at period Tn the sum of the output of the adder at period Tn−1 and the value of the period Tclock delivers by the memory 67.

As the value of the value received by the comparator 68 is greater than the period Tclock, the comparator 68 delivers a logical "0" to the monitoring circuit 29 so that the monitoring circuit 29 does not send a message to stop the transmission of the first control signal Sc.

As soon as the state of the control signal Sc does not change during one period Tclock, the AND logical operator 61 delivers a logical "0" so that the switch 62 connects the first input 63 with the output of the switch 62.

The output of the adder 66 delivers at period Tn the sum of the output of the adder at period Tn−1 and "0".

As the value of the value received by the comparator 68 is equal to the period Tclock, the comparator 68 delivers a logical "1" to the monitoring circuit 29 so that the monitoring circuit 29 sends a message to stop the transmission of the first control signal Sc.

Figure 5:
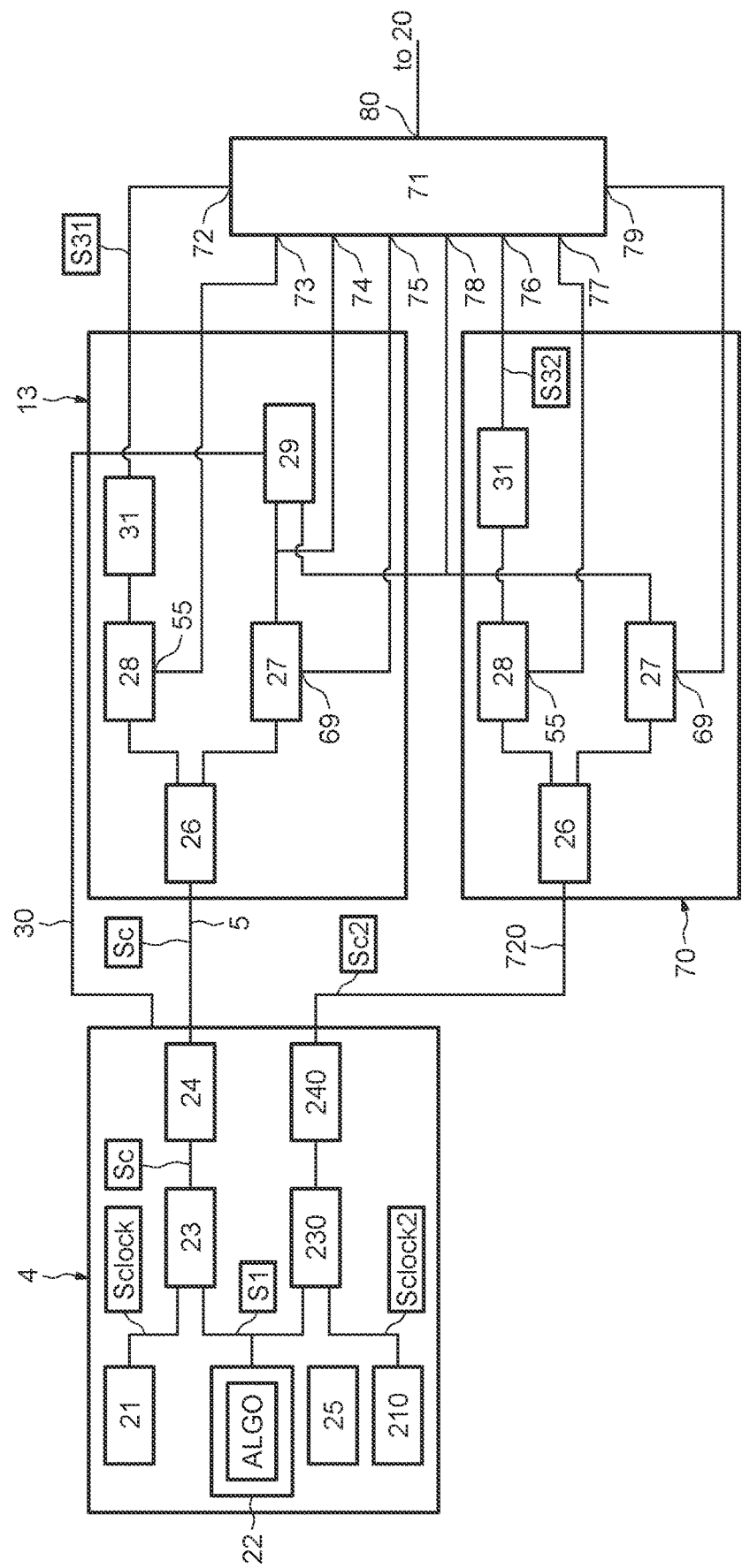
FIG. 5 illustrates another example of the monitoring system according to the invention.

FIG. 5 illustrates schematically another example of the monitoring system.

The monitoring comprises the control unit 4, the monitoring device 13, a second monitoring device 70 different from the monitoring device 13 in that it does not comprise the monitoring circuit 29, and a selection circuit 71.

The control unit 4 further comprises a second clock 210 generating a second clock signal Sclock2 at the predetermined frequency Fc, a second merging circuit 230, and a second transmitter 240.

The second merging circuit 230 comprises a XOR logical operator to merge the second clock signal Sclock2 and the first variable signal S1, and delivers a second control signal Sc2 to the second transmitter 240.

The second transmitter 240 delivers the second control signal Sc2 on a second wired connection 720, for example an optical fibre.

The second control signal Sc2 is received by the receiving circuit 26 of the second monitoring device 70 through the second wired connection 720.

The processing unit 25 further implements the second clock 210, the second merging circuit 230 and the second transmitter 240.

The second monitoring device 70 delivers a variable control signal S32 to control the gate drivers 20.

Generally, the signals S31, S32 delivered by the control circuits 31 of the monitoring devices 13, 70 are identical.

The monitoring device 13 is connected to the control unit 4 through the wired connection 5 and the feed-back wired connection 30 as described above.

The selection circuit 71 comprises eight inputs 72, 73, 74, 75, 76, 77, 78, 79 and one output 80.

A first input 72 and a fifth input 76 are connected to the output of the control circuit 31 respectively of the monitoring device 13 and the second monitoring device 70.

A second input 73 and a sixth input 77 are connected to the second output 55 of the decoding circuit 28 respectively of the monitoring device 13 and the second monitoring device 70.

A third input 74 and a seventh input 78 are connected to the output of the determining circuit 27 respectively of the monitoring device 13 and the second monitoring device 70.

A fourth input 75 and an eighth input 79 are connected to the second output 69 of the determining circuit 27 respectively of the monitoring device 13 and the second monitoring device 70.

The output 80 is connected to the gate drivers 20.

At the start-up of the power supply system, the selection circuit 71 determines which one of the monitoring devices 13 and the second monitoring device 70 is first ready for controlling the gates 20 of the power converter, and connects the control circuit 31 of the first ready monitoring device with the gates drivers 20.

Further, when the present monitoring device controlling the gates 20 detects a fault and the other monitoring device is ready to deliver the signal S31, S32, the selection circuit 71 connects the control circuit 31 of the functional monitoring device 13, 70 to the gate drivers 20 so that the load 2 is still supplied by the power converter 1, and the monitoring circuit 29 sends a message to the control unit 4 to stop the transmission of the control signal by the transmitter connected to the monitoring device detecting the fault.

If the transmission of the control signal to the power converter is transmitted again by the monitoring device detecting the fault after repairing, the power converter is still controlled by the other decoded variable signal S31, S32 as long as the other control signal S31, S32 is transmitted to the power controller.

The monitoring devices 13, 70 and the selection circuit 71 provide a redundancy so that the power controller 1 remains controlled to supply the load 2 when one monitoring device 13, 70 detects a fault.

Figure 6:
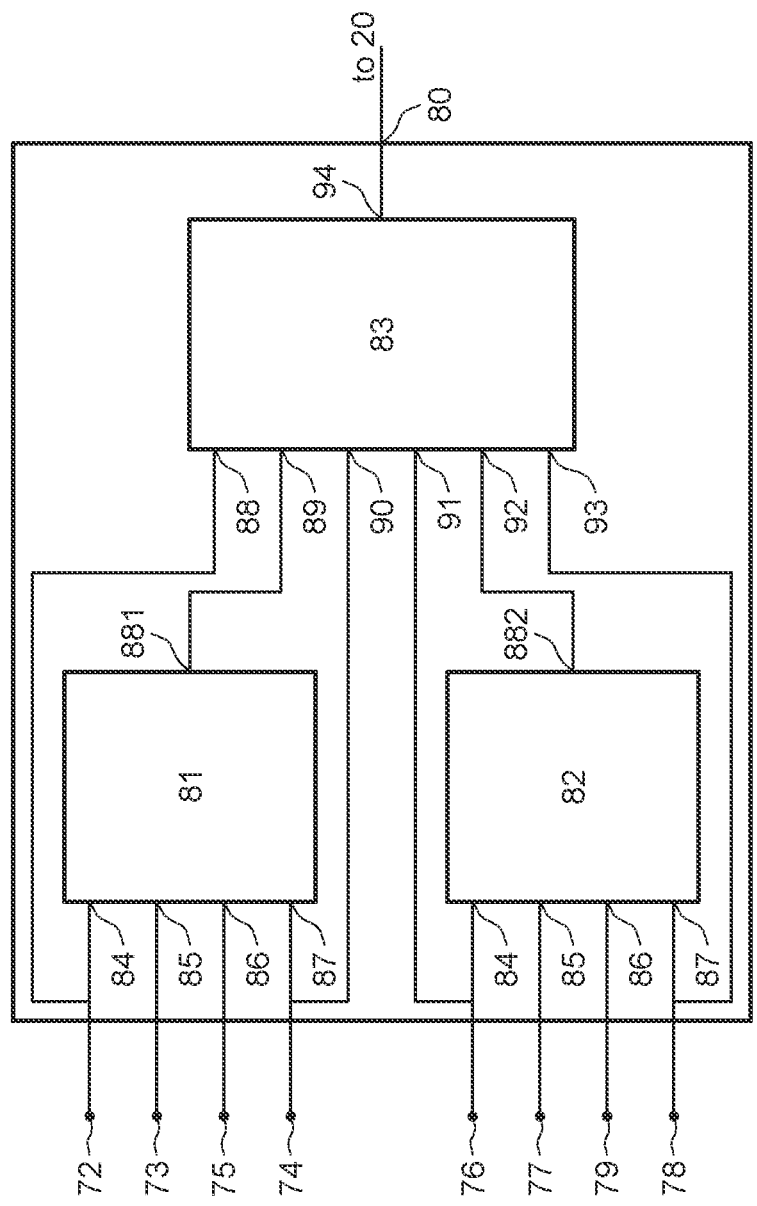
FIG. 6 illustrates an example of the selection circuit according to the invention.

FIG. 6 illustrates schematically an example of the selection circuit 71.

The selection circuit 71 comprises two identical monitoring units 81, 82 and a switching circuit 83.

Each monitoring unit 81, 82 comprises a first input 84, a second input 85, a third input 86, and a fourth input 87.

A first monitoring unit 81 further comprises an output 881 and the second monitoring unit 82 further comprises an output 882.

The first input 84 of the first monitoring unit 81 and the first input 84 of the second monitoring unit 82 are respectively connected to the first and the fifth inputs 72, 76 of the selection circuit 71.

The second input 85 of the first monitoring unit 81 and the second input 85 of the second monitoring unit 82 are respectively connected to the second and sixth inputs 73, 77 of the selection circuit 71.

The third input 86 of the first monitoring unit 81 and the third input 86 of the second monitoring unit 82 are respectively connected to the fourth input 75 and an eighth input 79 of the selection circuit 71.

The fourth input 87 of a first monitoring unit 81 and the fourth input 87 of the second monitoring unit 82 are respectively connected to the third input 74 and a seventh input 78 of the selection circuit 71.

The switching circuit 83 comprises six inputs 88, 89, 90, 91, 92, 93 and one output 94.

A first input 88 and a fourth input 91 are respectively connected to the first and fifth inputs 72, 76 of the selection circuit 71.

A second input 89 and a fifth input 92 are respectively connected to the outputs 881, 882 of the monitoring unit 81, 82.

A third input 90 and a sixth input 93 are respectively connected to the third input 74 and a seventh input 78 of the selection circuit 71.

The output 94 of the switching circuit 83 is connected to the output 80 of the selection circuit 71.

Figure 7:
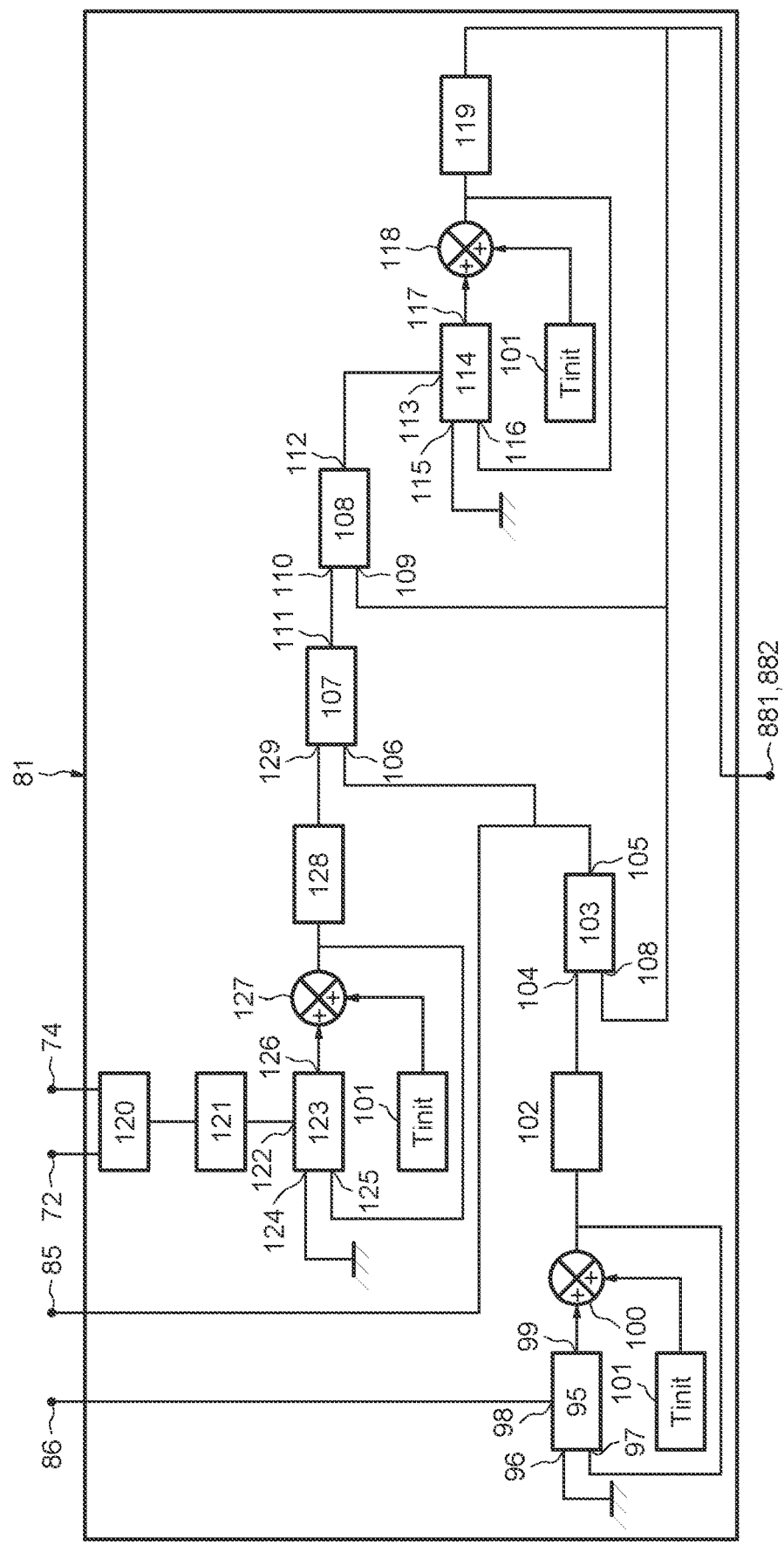
FIG. 7 illustrates an example of a monitoring unit according to the invention.

As the monitoring units 81, 82 are identical, FIG. 7 illustrates schematically an example of the monitoring unit 81.

The monitoring unit 81 comprises a switch 95 comprising a first input 96 connected to a mass delivering a "0" in Boolean algebra, a second input 97, and a control input 98 connected to the third input 86 of the first monitoring unit 81.

When the third input 86 delivers a "1" in Boolean algebra, the second input 97 is connected with the output 99.

When the third input 86 delivers a "0" in Boolean algebra, the first input 96 is connected with the output 99.

An output of the switch 99 is connected to a first input of an adder 100.

A memory 101 delivers a value of an initialization value Tinit on a second input of the adder 100.

The initialization value Tinit is equal or greater than the starting time of the control unit 4 and is for example equal to 1 second.

An output of the adder 100 delivers the sum of the signals received on his first and second inputs to the second input 97 of the switch 95 and to an input of a comparator 102.

The comparator 102 compares the received value to the value of the initialization value Tinit.

If the received value is greater than the initialization value Tinit, the comparator 102 generates an "1" in Boolean algebra on a set input 104 of a latch 103, and "0" otherwise.

The RS latch 103 is a set-reset latch.

An output 105 of the RS latch 103 is connected to the second input 85 of the first monitoring unit 81 and a first input 106 of a AND logical operator 107.

The reset input 108 of the RS latch 103 is connected to a reset input 109 of a second RS latch 108 and the output 881.

A set input 110 of the second RS latch 108 is connected to an output 111 of the AND logical operator 107.

An output 112 of the second RS latch 108 is connected to a control input 113 of a second switch 114.

The second switch 114 further comprises a first input 115 connected to a mass delivering a "0" in Boolean algebra, a second input 116 and an output 117.

When the output 112 of the second RS latch 108 delivers a "1" in Boolean algebra, the second input 116 is connected with the output 117.

When the output 112 of the second RS latch 108 delivers a "0" in Boolean algebra, the first input 115 is connected with the output 117.

The output 117 of the second switch 114 is connected to a first input of a second adder 118.

The memory 101 delivers a value of an initialization delay Tinit on a second input of the second adder 118.

An output of the second adder 118 delivers the sum of the signals received on his first and second inputs to an input of a second comparator 119.

The comparator 119 compares the received value to the value of the initialization value Tinit.

If the received value is smaller than the initialization value Tinit, the second comparator 119 generates an "1" in Boolean algebra on the output 881 and "0" otherwise.

A first input of a OR logical operator 120 is connected to the first input 72, and a second input of the OR logical operator 120 is connected to the third input 74.

An output of the OR logical operator 120 is connected to the input of a NOT logical operator 121.

An output 112 of the NOT logical operator 121 is connected to a control input 122 of a third switch 123.

The third switch 123 further comprises a first input 124 connected to a mass delivering a "0" in Boolean algebra and comprises a second input 125 and an output 126.

When the output of the NOT logical operator 121 delivers a "1" in Boolean algebra, the second input 125 is connected with the output 126.

When the output of the NOT logical operator 121 delivers a "0" in Boolean algebra, the first input 124 is connected with the output 126.

The output 126 of the third switch 123 is connected to a first input of a third adder 127.

The memory 101 delivers a value of an initialization delay Tinit on a second input of the second adder 127.

An output of the third adder 127 delivers the sum of the signals received on his first and second inputs to an input of a third comparator 128.

The third comparator 128 compares the received value to the value of the initialization value Tinit.

If the received value is greater than the initialization value Tinit, the third comparator 128 generates an "1" in Boolean algebra on a second input 129 of the AND logical operator 107 and "0" otherwise.

The first and second monitoring units 81, 82 determine respectively when the first and the second monitoring devices 70, 13 are ready to deliver the signals S31, S32 to drive the gate drivers 20.

The sequence to detect if the transmitters 24, 240 are ready is as follows.

Only the clock signal Sclock, Sclock2 is received by the monitoring device 81, 82 during at least the duration Tinit.

Then a reset of the outputs of the control unit 4 is set during the duration Tinit.

It is assumed that the transmitters are ready if the monitoring unit 81, 82 received the clock signal Sclock, Sclock2 during at least the duration Tinit.

Figure 8:
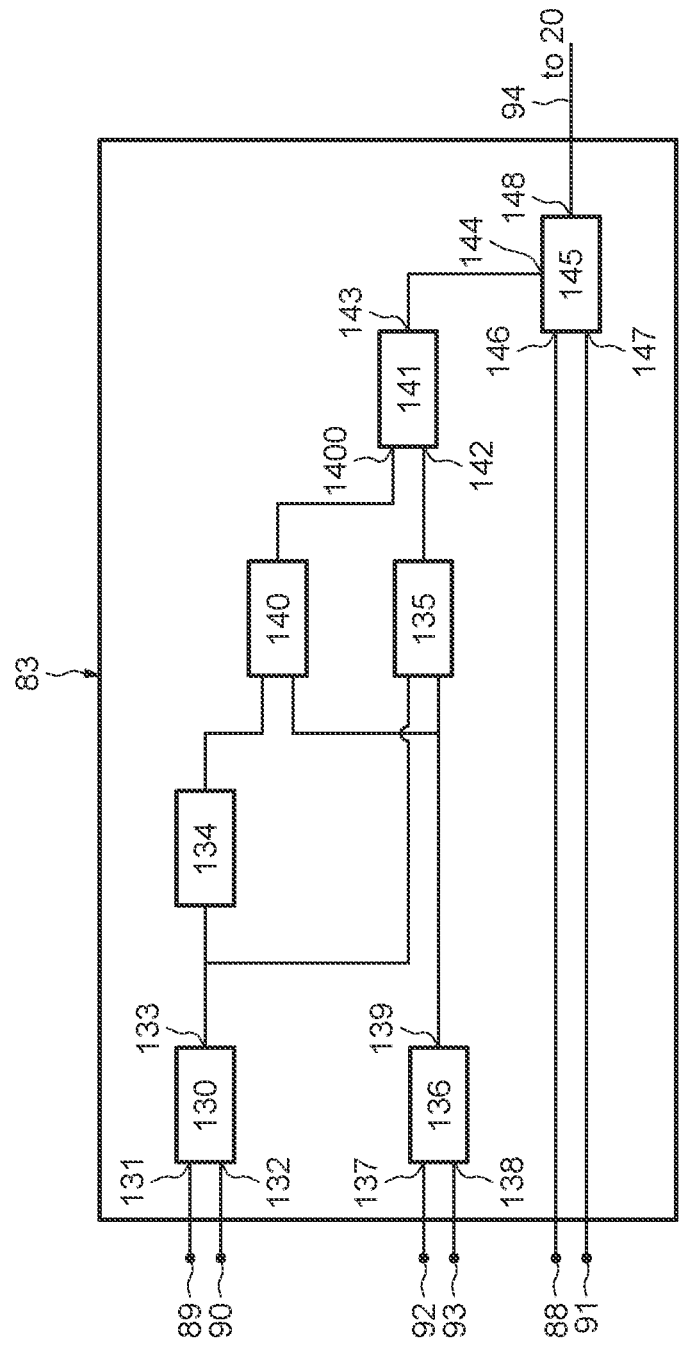
FIG. 8 illustrates an example of switching circuit according to the invention.

FIG. 8 illustrates schematically an example of the switching circuit 83.

The switching circuit 83 comprises a first latch 130 and a second latch 136, the first and second latches 130, 136 being set-reset latches.

The first latch 130 comprises a set input 131 connected to the second input 89 of the switching circuit 83, a reset input 132 connected to the third input 90 of the switching circuit 83, and an output 133 connected to an input of a logical NOT operator 134 and to a first input of a logical XOR operator 135.

The second latch 136 comprises a set input 137 connected to the fifth input 92 of the switching circuit 83, a reset input 138 connected to the sixth input 93 of the switching circuit 83, and an output 139 connected to a first input of a logical AND operator 140 and to a second input of the logical XOR operator 135.

An output of the logical AND operator 140 is connected to a data input 1400 of a gated D latch 141.

The gated D latch 141 comprises a clock input 142 connected to an output of logical XOR operator 135, and an output 143 connected to a control input 144 of a switch 145.

The switch 145 further comprises a first input 146 connected to the first input 88, a second input 147 connected to the fourth input 91, and an output 148 connected to the output 94.

At the starting of the power supply system, if the monitoring unit 81 detects that the monitoring device 13 is first ready to drive the gate drivers 20, the first input 146 of the switch 145 is connected to the output 148.

If the second monitoring unit 82 detects that the second monitoring device 70 is first ready to drive the gate drivers 20, the second input 147 of the switch 145 is connected to the output 148.

The invention claimed is:

1. A method for monitoring a control signal received by a power converter, the control signal controlling switches of the power converter to supply an electrical load, characterized in that the method comprises:

receiving by the power converter the control signal comprising a merging of a first variable signal and a clock signal having a predetermined frequency greater than the first variable signal, the first variable signal comprising instructions to control the switches, wherein as the control signal comprises the clock signal, a state of the control signal changes at least one time every period, determining if a change of state of the control signal occurs during each period associated to the predetermined frequency, and if a change of state of the control signal does not occur during one period, stopping the transmission of the control signal to the power converter so that the power converter stops to supply the electrical load according to the instructions of the first variable signal.

2. The method according to claim 1, wherein merging the first variable signal and the clock signal comprises combining the first variable signal and the clock signal by XOR logical operator to obtain the control signal.

3. The method according to claim 1, further comprising when a change of state of the control signal occurs during each period:

decoding the control signal by a decoding circuit of the power control to extract the first variable signal, and controlling the power converter according to the decoded first variable signal.

4. The method according to claim 3, wherein decoding the control signal comprises:

determining the frequency and the phase of the clock signal from the control signal, providing two intermediate signals from the determined frequency and phase, the frequency of a first intermediate signal being equal to the determined frequency and the phase of the first intermediate signal being equal to the determined phase so that the first intermediate signal is an estimation of the clock signal, and the frequency of second intermediate signal being equal to twice the determined frequency and the phase of the second intermediate signal being shifted so that the raising edge of the second intermediate signal is centred on the middle of the high state of the first intermediate signal, combining the control signal and first intermediate signal by XOR logical operator to obtain an intermediate control signal, and sampling the intermediate control signal with the raising edge of the second intermediate signal to generate a first variable control signal b-within a predetermined value, the first variable control signal being configured to control the switches.

5. The method according to claim 1, further comprising:
determining if a change of state of a second control signal occurs during each period associated to the predetermined frequency, the second control signal comprising the variable signal comprising instructions to control the switches merged with a second clock signal having the predetermined frequency,
if a change of state of a second control signal occurs during each period associated to the predetermined frequency, decoding the second control signal to extract a second variable control signal, and
when the transmission of the control signal to the power converter is stopped, controlling the power converter according to the second variable control signal.

6. The method according to claim 5, wherein when the control signal to the power converter is transmitted again, the power converter remains controlled by the second variable control signal as long as the second control signal is being transmitted to the power controller.

7. A monitoring device for monitoring a control signal received by a power converter, the control signal controlling switches of the power converter to supply an electrical load, characterized in that the monitoring device comprising:
a receiving circuit configured to receive the control signal-(Se) comprising a merging of a first variable signal and a clock signal having a predetermined frequency greater than the first variable signal, the first variable signal comprising instructions to control the switches, wherein as the control signal comprises the clock signal, a state of the control signal changes at least one time every period,
a determining circuit configured to determine if a change of state of the control signal occurs during each period associated to the predetermined frequency, and
a monitoring circuit configured to stop the transmission of the control signal to the power converter so that the power converter stops to supply the electrical load according to the instructions of the first variable signal if a change of state of the control signal does not occur during one period.

8. The monitoring device according to claim 7, further comprising
a decoding circuit configured to decode the control signal to extract a first variable control signal, and
a control circuit configured to control the power converter according to the first variable control signal,
the decoding circuit being configured to:
determine the frequency and the phase of the clock signal from the control signal, provide two intermediate signals from the determined frequency and phase,
the frequency of a first intermediate signal being equal to the determined frequency and the phase of the first intermediate signal being equal to the determined phase so that the first intermediate signal is an estimation of the clock signal, and the frequency of second intermediate signal being equal to twice the determined frequency and the phase of the second intermediate signal being shifted so that the raising edge of the second intermediate signal is centred on the middle of the high state of the first intermediate signal,
combine the control signal and first intermediate signal by XOR logical operator to obtain an intermediate control signal, and
sample the intermediate control signal with the raising edge of the second intermediate signal to generate the first variable control signal within a predetermined value when a change of state of the control signal occurs at each period.

9. A monitoring system for monitoring a control signal received by a power converter comprising:
at least one monitoring device according to claim 7, and
a control unit connected to the receiving circuit of the monitoring device with a first wired connection,
the control unit comprising a merging circuit to merge the first variable signal and the clock signal by a XOR logical operator to obtain the control signal and a transmitter to transmit the control signal to the monitoring device through the first wired connection.

10. A monitoring system for monitoring a control signal received by a power converter comprising:
at least one monitoring device for monitoring a control signal received by a power converter, the control signal controlling switches of the power converter to supply an electrical load, characterized in that the monitoring device comprising:
a receiving circuit configured to receive the control signal comprising a merging of a first variable signal and a clock signal having a predetermined frequency greater than the first variable signal, the first variable signal comprising instructions to control the switches,
a determining circuit configured to determine if a change of state of the control signal occurs during each period associated to the predetermined frequency, and
a monitoring circuit configured to stop the transmission of the control signal to the power converter so that the power converter stops to supply the electrical load according to the instructions of the first variable signal if a change of state of the control signal does not occur during one period, and
a control unit connected to the receiving circuit of the monitoring device with a first wired connection,
the control unit comprising a merging circuit to merge the first variable signal and the clock signal by a XOR logical operator to obtain the control signal and a transmitter to transmit the control signal to the monitoring device through the first wired connection,
the monitoring system further comprising a second monitoring device according to claim 8,
a second wired connection connecting the receiving circuit of the second monitoring device to the control unit, and a selection circuit, the control unit further comprising:
a second merging circuit configured to merge the first variable signal with a second clock signal having the predetermined frequency to obtain a second control variable signal,
a second transmitter configured to transmit the second control variable signal to the second monitoring device through the second wired connection,
the selection circuit being configured to transmit the extracted second variable control signal to control the switches of the power converter to supply the electrical load according to the instructions of the second variable control signal if a change of state of the second control signal occurs during each period associated to the predetermined frequency and if the transmission of the control signal to the power converter is stopped.

11. The monitoring system according to claim 10, wherein the selection circuit is further configured to still transmit the second variable control signal if the transmission of the control signal to the power converter is transmitted again as long as the second control signal is transmitted to the power controller.

12. A power supply system comprising a converter including gate drivers driving the switches of the power converter, and a monitoring system according to claim 9, each monitoring device being coupled to the gate drivers.

* * * * *

UNITED STATES PATENT AND TRADEMARK OFFICE
CERTIFICATE OF CORRECTION

| | | |
|---|---|---|
| PATENT NO. | : 12,341,413 B2 | Page 1 of 1 |
| APPLICATION NO. | : 18/356869 | |
| DATED | : June 24, 2025 | |
| INVENTOR(S) | : Franck Terrien | |

It is certified that error appears in the above-identified patent and that said Letters Patent is hereby corrected as shown below:

In the Claims

Column 13, Line 1 Claim 4, replace "first variable control signal b-within a predetermined" with --first variable control signal within a predetermined--

Column 13, Line 29 Claim 7, replace "nal-(Se) comprising a merging of a first variable signal" with --nal comprising a merging of a first variable signal--

Signed and Sealed this
Twenty-sixth Day of August, 2025

Coke Morgan Stewart
*Acting Director of the United States Patent and Trademark Office*